United States Patent
Lin et al.

(10) Patent No.: US 8,198,703 B2
(45) Date of Patent: Jun. 12, 2012

(54) ZENER DIODE WITH REDUCED SUBSTRATE CURRENT

(75) Inventors: Xin Lin, Phoenix, AZ (US); Daniel J. Blomberg, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 174 days.

(21) Appl. No.: 12/689,120

(22) Filed: Jan. 18, 2010

(65) Prior Publication Data

US 2011/0175199 A1 Jul. 21, 2011

(51) Int. Cl.
*H01L 29/06* (2006.01)

(52) U.S. Cl. ........ 257/603; 257/106; 257/175; 257/199; 257/481; 257/E29.335

(58) Field of Classification Search .......... 257/603–606, 257/E29.335, E29.005, 106, 186, 199, 175, 257/481, 493, 551, E29.18, E29.334, E29.355, 257/E29.356

See application file for complete search history.

(56) References Cited

U.S. PATENT DOCUMENTS

| | | | |
|---|---|---|---|
| 4,683,483 A | 7/1987 | Burnham et al. | |
| 5,242,841 A | 9/1993 | Smayling et al. | |
| 5,414,292 A | 5/1995 | Williams | |
| 5,453,384 A | 9/1995 | Chatterjee | |
| 5,578,862 A | 11/1996 | Fujii et al. | |
| 6,031,702 A | 2/2000 | Williams | |
| 6,268,639 B1 | 7/2001 | Li et al. | |
| 6,586,780 B1 | 7/2003 | Terashima | |
| 6,617,650 B1 | 9/2003 | Chen et al. | |
| 6,919,603 B2 | 7/2005 | Brodsky et al. | |
| 6,933,546 B2 | 8/2005 | Khemka et al. | |
| 2004/0000700 A1* | 1/2004 | Romas et al. | 257/603 |
| 2004/0183098 A1* | 9/2004 | Khemka et al. | 257/200 |
| 2005/0245020 A1 | 11/2005 | Zhu et al. | |
| 2007/0200136 A1 | 8/2007 | Zhu et al. | |

FOREIGN PATENT DOCUMENTS

JP 57012563 1/1982

* cited by examiner

*Primary Examiner* — Victor A Mandala
*Assistant Examiner* — Selim Ahmed
(74) *Attorney, Agent, or Firm* — Ingrassia Fisher & Lorenz, PC

(57) ABSTRACT

A Zener diode is fabricated on a semiconductor substrate having semiconductor material thereon. The Zener diode includes a first well region having a first conductivity type, formed in the semiconductor material. The Zener diode also includes a first region having a second conductivity type, formed in the first well region (the second conductivity type is opposite the first conductivity type). The Zener diode also includes a second region having the first conductivity type, wherein the second region is formed in the first well region and overlying the first region. An electrode is formed in the first region, and the electrode is electrically coupled to the second region.

16 Claims, 6 Drawing Sheets

ZENER DIODE WITH REDUCED SUBSTRATE CURRENT

TECHNICAL FIELD

Embodiments of the subject matter described herein relate generally to semiconductor devices. More particularly, the subject matter relates to isolated Zener diodes.

BACKGROUND

Zener diodes are some of the most extensively-used components in semiconductor technology, and they are used for a wide variety of applications, including voltage regulation and protection from electrostatic discharge events. Two different kinds of current may affect the operation of a Zener diode at breakdown: impact ionization (or avalanche breakdown) current; and tunneling (or Zener breakdown) current. The term "Zener diode" as it is classically used, and as it will be used herein, refers to a diode in which tunneling breakdown and avalanche breakdown occur simultaneously.

In power integrated circuit (IC) technology, the Zener diode is commonly integrated into a circuit and is in "discrete" form as a separate unit. In general, Zener diodes, especially when used in smart power technologies, should have both zero temperature coefficient ("zero TC") and long term stability. Zero temperature coefficient means that the reverse breakdown voltage is substantially invariant with temperature, within a useful temperature range. Long term stability means that the reverse breakdown voltage and reverse leakage current do not change with time over the useful life of the device. Due to the zero TC and long term stability of Zener diodes, they are widely used in voltage clamping and reference. However, conventional Zener diodes suffer from substrate current injection when forward biased and when reverse biased. This substrate current injection may result in design difficulty because substrate current results in a differential between the anode terminal current and the cathode terminal current. More importantly, a high substrate current injected from the Zener diode(s) may also disturb operation of other devices that share the same semiconductor substrate as the Zener diode(s).

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
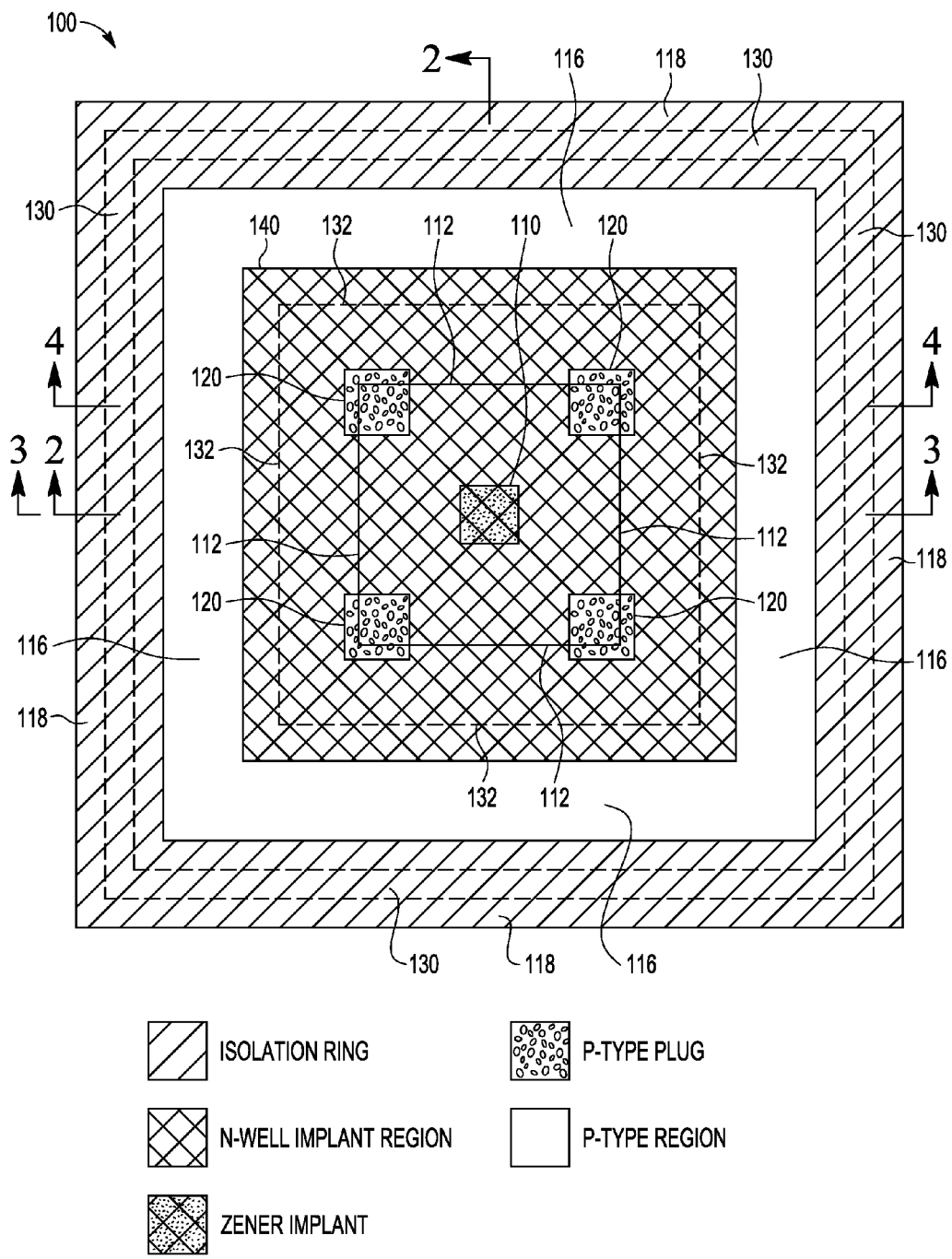
FIG. 1 is a top phantom view of a semiconductor-based vertical Zener diode device configured in accordance with an embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain terminology may be used in the following description for the purpose of reference only, and thus are not intended to be limiting. For example, terms such as "upper", "lower", "above", and "below" may refer to directions in the drawings to which reference is made. Other terms such as "front", "back", "rear", "side", "outboard", and "inboard" may be used to describe the orientation and/or location of elements within a consistent but arbitrary frame of reference which is made clear by reference to the text and the associated drawings describing the element under discussion. Such terminology may include the words specifically mentioned above, derivatives thereof, and words of similar import. Similarly, the terms "first", "second" and other such numerical terms referring to structures do not imply a sequence or order unless clearly indicated by the context.

The terms "inboard" and "outboard" as used herein relate to position relative to a central axis of symmetry or other point, line or plane of reference. Thus, "inboard" means closer to the reference than another component, while "outboard" means further from the reference than another component. In this regard, an outboard feature, element, or region could completely (or partially) surround an inboard feature, element, or region. Moreover, an inboard feature, element, or region could be flanked by one or more outboard features, elements, or regions. Unless otherwise indicated, the frame of reference in this disclosure is a center line or plane of symmetry.

Zener diodes and their operating principles are well known. A Zener diode allows current to flow in the forward direction (similar to normal diodes), and it also allows current to flow in the reverse direction if the applied voltage is greater than the reverse breakdown voltage. This breakdown voltage is sometimes referred to as the "Zener knee voltage" or simply the "Zener voltage." Zener diodes can be fabricated as semiconductor devices using known semiconductor manufacturing techniques, technologies, and processes. Accordingly, for the sake of brevity, conventional techniques and aspects of semiconductor devices, Zener diode design, and semiconductor device fabrication need not be described in detail herein.

Zener diodes are commonly realized using either a lateral device structure or a vertical device structure. In a lateral Zener diode, the reverse breakdown current primarily occurs at or near the surface of the device structure; in a vertical Zener diode, the reverse breakdown current primarily occurs deeper below the surface. In either case, conventional Zener diodes exhibit undesirably high substrate current at and beyond the reverse breakdown point. In practice, a high amount of electrons is injected into the cathode region of a Zener diode during breakdown, which dramatically increases the hole density at the edge of the p-n junction on the cathode side (due to charge neutrality requirements). In turn, some excess holes diffuse to the p-n junction formed between an n-type cathode region and the underlying p-type substrate. The electric field across this p-n junction sweeps the holes into the p-type substrate, forming a high injected substrate current. The substrate current caused by the Zener diode breakdown is undesirable, because it can disturb operation of other components and devices of the circuit with which the Zener diode is integrated. Accordingly, reducing the substrate current during Zener breakdown can be highly desirable for many applications.

Figure 2:
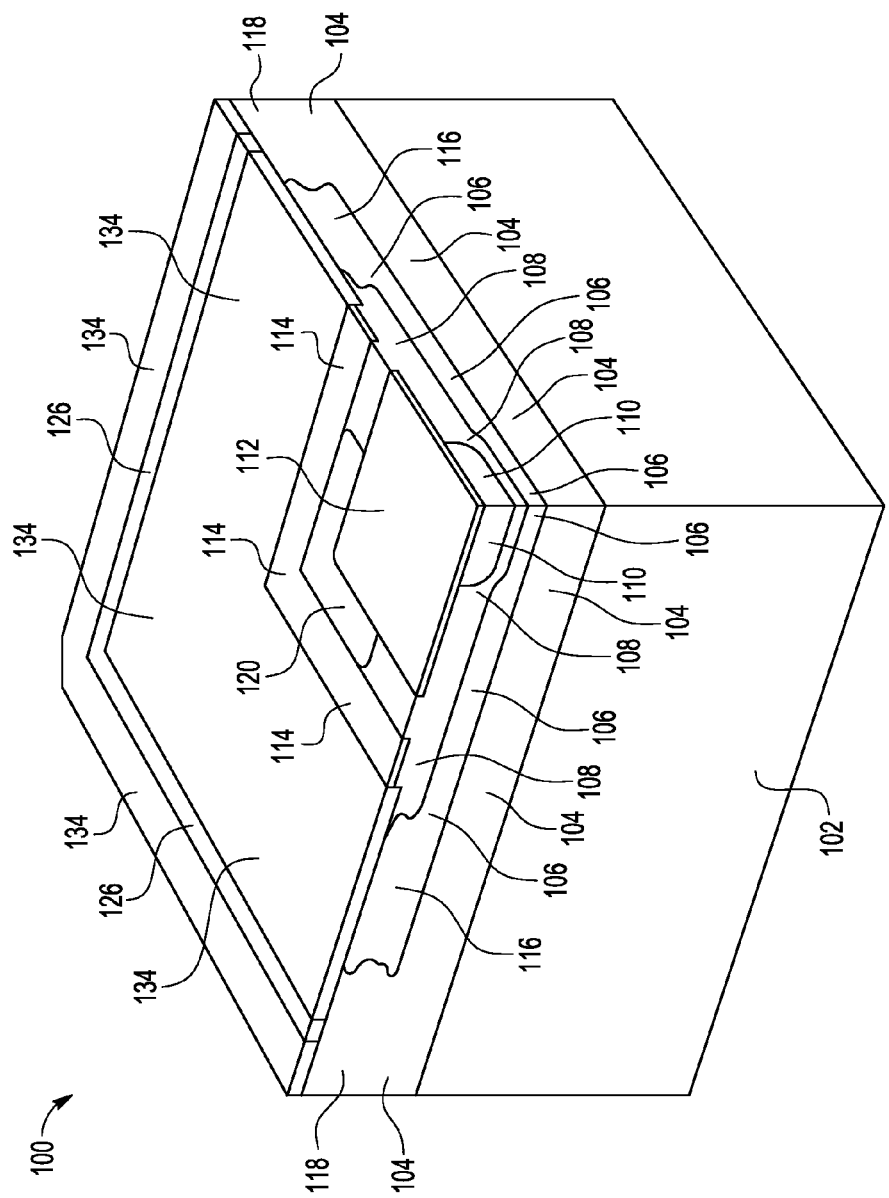
FIG. 2 is a perspective cross sectional view of a portion of the vertical Zener diode, as generally defined by the line 2-2 shown in FIG. 1.
Figure 3:
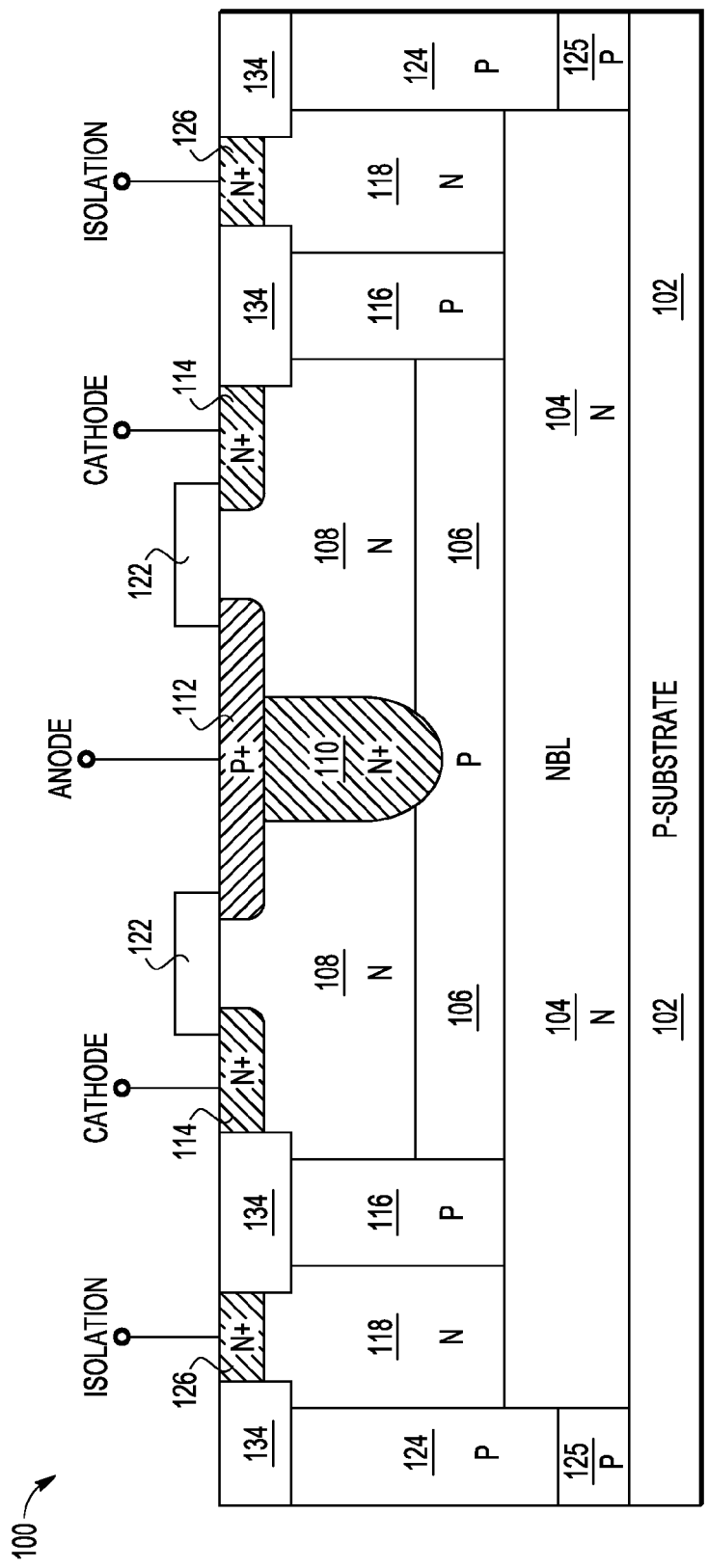
FIG. 3 is a cross sectional view of the vertical Zener diode, as viewed along line 3-3 shown in FIG. 1.
Figure 4:
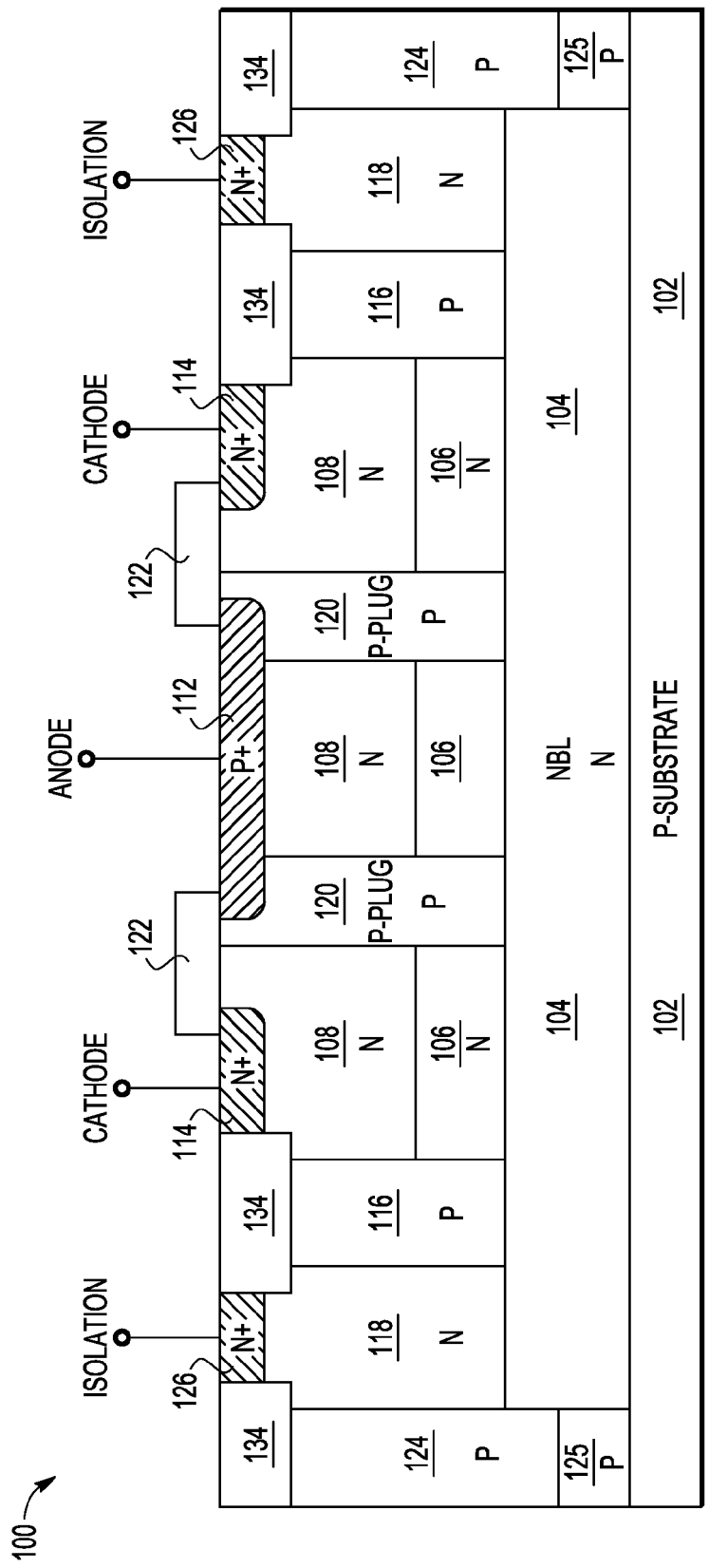
FIG. 4 is a cross sectional view of the vertical Zener diode, as viewed along line 4-4 shown in FIG. 1.

FIG. 1 is a top phantom view of an exemplary embodiment of a semiconductor-based vertical Zener diode device 100, FIG. 2 is a perspective cross sectional view of a portion of the vertical Zener diode 100 (taken through a section as generally defined by the line 2-2 shown in FIG. 1), FIG. 3 is a cross sectional view of the vertical Zener diode 100 (as viewed along line 3-3 shown in FIG. 1), and FIG. 4 is a cross sectional view of the vertical Zener diode 100 (as viewed along line 4-4 shown in FIG. 1). For clarity and ease of illustration, the scale used in FIGS. 1-4 is not uniform.

Due to the three-dimensional nature of the vertical Zener diode 100, FIG. 1 shows the outline or perimeter of certain structures, implant regions, features, elements, or areas that may overlap one another when viewed from above. In other words, the vertical Zener diode 100 includes a number of different structures, implant regions, features, elements, or areas that may fully or partially overlie or underlie one another. This arrangement of the vertical Zener diode 100 is shown more clearly in FIGS. 2-4.

The vertical Zener diode 100 is formed on a semiconductor substrate 102. The semiconductor material used for the semiconductor substrate 102 is preferably a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material used for the semiconductor substrate 102 can be doped to be either n-type or p-type, but is typically p-type. As used here, an n-type semiconductor material is a semiconductor material that has an abundance of mobile or "carrier" electrons in the material, while a p-type semiconductor material is a semiconductor material that has an abundance of electron acceptors or holes in the material. An n-type silicon material can be formed by introducing an appropriate impurity species (e.g., phosphorus, arsenic, or antimony) into the silicon material, and a p-type silicon material can be formed by introducing an appropriate impurity species (e.g., boron or aluminum) into the silicon material. For this particular embodiment, the semiconductor substrate 102 is a lightly doped p-type material having a doping concentration within the range of about $1\times10^{15}$ to $5\times10^{15}$ cm$^{-3}$. The semiconductor material may be provided on a bulk semiconductor substrate, or it could be provided on a silicon-on-insulator (SOI) substrate, which includes a support substrate, an insulator layer on the support substrate, and a layer of silicon material on the insulator layer.

This particular embodiment of the vertical Zener diode 100 includes the following structures, features, implant regions, areas, and elements, without limitation: a deep n-type implant or an n-type buried layer (NBL) 104; a first p-type region 106; a first n-type region 108; a Zener implant region 110; an anode (electrode) region 112; a cathode (electrode) contact region 114; a second p-type region 116; a second n-type region 118; and four p-type plug regions 120. In alternate embodiments, conductive routing, metal interconnect structures, or other electrically conductive elements could be used instead of the p-type plug regions 120. The term "Zener implant region" is used here for convenience and for ease of description, and its use is not intended to suggest that a particular implant region or a devoted implant region must be used in this context. Accordingly, "Zener implant region" is used in this description to avoid confusing terminology and to better distinguish this implant from other implants in the device structure. In this regard, in some embodiments, the Zener implant region 110 could be realized using one or more existing implant regions that rather than a separate and dedicated implant. Such embodiments could reduce manufacturing process cost and result in a simplified fabrication procedure.

Although not depicted in FIG. 1 or FIG. 2, the vertical Zener diode 100 may also include a silicide block 122 (which would appear as a ring if viewed from the top). In practice, the structures, regions, and elements of the vertical Zener diode 100 listed above may be formed within an outer p-type region 124 of the semiconductor substrate 102, as is understood by those familiar with semiconductor technology. This outer p-type region 124 is not shown in FIG. 1 or FIG. 2. In certain embodiments, a lightly doped p-type region 125 is located under the outer p-type region 124. This lightly doped p-type region 125 may be formed by a blanket implant before the NBL implant and formation of the epitaxial semiconductor layer (which is described below). This lightly doped p-type region 125 can effectively prevent punch-through between two adjacent NBL regions.

Although the exemplary embodiment described here employs the NBL 104, alternate embodiments may instead employ a deep n-type implant, which may be used to form an isolation region that functions in the manner described below. These two and possibly other equivalent implementations are contemplated here, and the NBL 104 is not required in all contemplated embodiments.

The anode region 112 and the cathode contact region 114 are formed in active semiconductor material at and near the upper surface of the vertical Zener diode 100. Moreover, the second n-type region 118 has an associated isolation contact region 126 that is located at and near the upper surface of the vertical Zener diode 100. This isolation contact region 126 is also formed in the active semiconductor material. FIG. 1 depicts this active semiconductor material in dashed lines. As shown in FIG. 1, a square shaped ring 130 of active semiconductor material corresponds to the isolation contact region 126, and a square region 132 of active semiconductor material is used to form the anode region 112 and the cathode contact region 114. In practice, the anode region 112 and the cathode contact region 114 can be formed using, for example, conventional source/drain implants, as is well understood. The silicide block 122 can be employed to ensure that silicide is not formed on some of the underlying active semiconductor material. Shallow trench isolation (STI) regions 134 reside between the active semiconductor materials, as depicted in FIGS. 2-4.

This particular embodiment of the vertical Zener diode 100 is configured as a three terminal device. The anode region 112 corresponds to one terminal, the cathode contact region 114 corresponds to a second terminal, and the isolation contact region 126 corresponds to the third terminal. The first and second terminals serve as the typical voltage terminals across the vertical Zener diode 100, as is well understood. The third terminal is used to bias the second n-type region 118 and the NBL 104, which serves as an isolation ring for the vertical Zener diode 100 (as described in more detail below).

It should be appreciated that although the figures depict various n-type and p-type regions in a defined and regular arrangement and orientation, in reality these regions can be formed by implanting ions of an appropriate impurity species into the semiconductor material (using specified implantation energy and doses, which may vary during the creation of a given region). In other embodiments, these regions may be formed by other doping methods other than implantation. Consequently, the boundary of a given n-type or p-type region need not (and typically will not) be as precisely defined as illustrated here. Indeed, the doping profile within a given region may vary with its depth, width, and/or other dimensions, and the transition between adjacent regions may be somewhat gradual, smooth, or tapered rather than immediate and abrupt as depicted in the figures.

In one exemplary embodiment, fabrication of the vertical Zener diode 100 begins with a wafer having a silicon-based semiconductor substrate 102, which can be a lightly or moderately doped p-type material. Next, the NBL 104 is formed by implanting ions of a suitable impurity species into the semiconductor substrate 102 to form an n-type region corresponding to the NBL 104. Thereafter, a p-type semiconductor material is epitaxially grown from the NBL 104. In certain embodiments, this p-type epitaxial material is grown to a thickness between approximately 0.5 to 5.0 microns. This p-type epitaxial material can then be used as the foundation for the other wells and implant regions of the vertical Zener diode 100, but the epitaxial material is not required for forming the vertical Zener diode 100. In other exemplary embodiments, a relatively thick p-type semiconductor substrate 102 could be used as the foundation for the various wells and implant regions of the vertical Zener diode 100. Indeed, the various regions and implants used to form the vertical Zener diode 100 could be achieved by implanting appropriate dopants into a bulk semiconductor substrate. These and possibly other variations could be employed to fabricate a vertical Zener diode 100 having the general structures, features, and regions depicted in FIGS. 1-4.

The NBL 104 is formed as a moderately doped n-type region overlying at least a portion of the semiconductor substrate 102. As depicted in FIG. 3 and FIG. 4, the NBL 104 is located between (and is surrounded by) the outer p-type region 124. In the illustrated embodiment, the NBL 104 extends to the outer p-type region 124. In certain embodiments, the NBL 104 has a doping concentration between about $1 \times 10^{17}$ cm$^{-3}$ to about $1 \times 10^{19}$ cm$^{-3}$, and the NBL 104 has a thickness (in the vertical dimension depicted in FIG. 3 and FIG. 4) between about 0.5 microns to about 3.0 microns.

The second n-type region 118 is formed overlying a portion of the NBL 104. In this example, the second n-type region 118 is formed at or near the outer periphery of the NBL 104. For the embodiment depicted in FIG. 1, the second n-type region 118 resembles a rectangular ring around the outer perimeter of the NBL 104, although other shapes and configurations could be used (e.g., a circular ring, an oval ring, a non-rectangular polygonal shape, etc.). Referring again to FIG. 3 and FIG. 4, the second n-type region 118 extends vertically from the upper surface (or near the upper surface) of the vertical Zener diode 100 to the NBL 104. For this particular embodiment, the second n-type region 118 resides between the outer p-type region 124 and the second p-type region 116. More specifically, the second n-type region 118 is adjacent to both the outer p-type region 124 and the second p-type region 116, as shown in FIG. 3 and FIG. 4. For this particular implementation, the second n-type region 118 comprises moderately doped n-type semiconductor material. In certain embodiments, the second n-type region 118 has a doping concentration between about $1 \times 10^{17}$ cm$^{-3}$ to about $1 \times 10^{18}$ cm$^{-3}$, and the second n-type region 118 has a thickness (in the vertical dimension depicted in FIG. 3 and FIG. 4) between about 0.5 microns to about 4.0 microns. In practice, the second n-type region 118 may be of the same composition as the NBL 104. In other words, the second n-type region 118 and the NBL 104 may be formed in the same semiconductor material, which has been subjected to appropriate ion implantation processes.

In this embodiment, the second n-type region 118 extends around the proximity of the outer perimeter of the vertical Zener diode 100, thereby surrounding the inner regions (as seen in FIG. 1). Thus, the second n-type region 118 forms vertical sides of an isolation tub, where the NBL 104 forms the base of the isolation tub. This isolation tub generally defines an interior volume in which the second p-type region 116, the first p-type region 106, the first n-type region 108, and the Zener implant region 110 are located. The isolation contact region 126 is formed in (or is coupled to) the second n-type region 118, such that a bias voltage can be applied to the isolation tub. The bias voltage may be, for example, zero volts, a supply voltage such as Vdd or Vss, or the like. In certain implementations, the isolation contact region 126 is realized as a heavily doped n-type region formed at the upper surface of the second n-type region 118. For example, the isolation contact region 126 may have a typical doping concentration between about $1 \times 10^{20}$ cm$^{-3}$ to about $1 \times 10^{22}$ cm$^{-3}$. The isolation tub is believed to be at least partially responsible for reduction or elimination of reverse breakdown substrate injection current. A similar isolation tub architecture is disclosed in United States Patent Publication Number 2007/0200136 A1, the relevant content of which is incorporated by reference herein.

The second p-type region 116 (which may also be referred to here as the first outer region) is formed overlying a portion of the NBL 104. In this example, the second p-type region 116 is formed near the outer periphery of the NBL 104, but inside the ring structure that is generally defined by the second n-type region 118. As depicted in FIG. 1, the second p-type region 116 is generally configured such that it resembles a rectangular ring-shaped (or other shape) sidewall that resides between the inner boundary of the second n-type region 118 and the common outer boundary of the first p-type region 106 and the first n-type region 108. Thus, the second p-type region 116 is located within the interior volume that is defined by the isolation tub, and the second p-type region 116 generally defines another interior volume in which the first p-type region 106, the first n-type region 108, and the Zener implant region 110 are located.

Referring again to FIG. 3 and FIG. 4, the second p-type region 116 extends vertically from the NBL 104 to a respective STI region 134. For this particular embodiment, an upper area of the second p-type region 116 resides between the second n-type region 118 and the first n-type region 108, and a lower area of the second p-type region 116 resides between the second n-type region 118 and the first p-type region 106. More specifically, the outer boundary of the second p-type region 116 is adjacent to the second n-type region 118, while the inner boundary of the second p-type region 116 is adjacent to both the first n-type region 108 and the first p-type region 106. For this particular implementation, the second p-type region 116 comprises moderately doped p-type semiconductor material. In certain embodiments, the second p-type region 116 has a doping concentration between about $1 \times 10^{17}$ cm$^{-3}$ to about $1 \times 10^{19}$ cm$^{-3}$, and the second p-type region 116 has a thickness (in the vertical dimension depicted in FIG. 3 and FIG. 4) between about 0.5 microns to about 4.0 microns. In alternate embodiments, the second p-type region 116 can extend vertically from the NBL 104 to the upper surface of the vertical Zener diode 100. The second p-type region 116 along with the first p-type region 106 can be coupled to the anode potential by the conductive routing, metal interconnect structures, or other electrically conductive elements instead of the p-type plug regions 120.

As shown in FIG. 3 and FIG. 4, the general arrangement of the semiconductor substrate 102, the NBL 104, the outer p-type region 124, the second n-type region 118, the second p-type region 116, and the isolation contact region 126 is about the same when viewed along any vertical or horizontal cross sectional line (i.e., lines that are parallel or orthogonal to line 2-2 in FIG. 1). In contrast, the structures, features, implant regions, and elements of the vertical Zener diode 100 that reside within the isolation tub will have different cross sectional appearances, depending upon the location of the cross section.

For this embodiment, the vertical Zener diode 100 employs p-type and n-type implants to form the first p-type region 106 and the first n-type region 108. As depicted in FIG. 3, the first n-type region 108 and the first p-type region 106 reside within the interior volume that is generally defined by the NBL 104 (at the bottom) and the second p-type region 116 (around the sides). In this regard, the first n-type region 108 and the first p-type region 106 are partially surrounded by the isolation tub. For the embodiment illustrated in FIG. 1, the common outer perimeter of the first n-type region 108 and the first p-type region 106 is generally defined by a square shaped boundary 140 (although this boundary need not be square, and different embodiments could employ any suitably shaped boundary). In alternate embodiments, the first n-type region 108 and the first p-type region 106 could have different boundaries. Notably, the first n-type region 108 is formed using a suitable ion implantation mask such that the four p-type plug regions 120 do not receive the n-type implant that is used to form the first n-type region 108 in this embodiment. In alternate embodiments, the four p-type plug regions 120 could receive the n-type implant when the p-type implant is heavier and deeper than the n-type implant. As shown in FIG. 3 and FIG. 4, the first p-type region 106 is formed overlying a portion of the NBL 104. The first n-type region 108 and the first p-type region 106 occupy the space generally defined above the NBL 104 and inboard the second p-type well region 116, excluding the p-type plug regions 120. More specifically, they extend to, and are adjacent to, the second p-type region 116, as shown in FIG. 3 and FIG. 4.

In certain embodiments, the first p-type region 106 and the first n-type region 108 are formed using chain implant techniques and using the same ion implantation mask. As is well understood, a chain implant is a series of ion implantations performed at different energies. Chain implants accommodate deep, intermediate, and shallow implantation of the desired impurity species, typically beginning with deeper implants and ending with shallower implants. In this regard, the deeper first p-type region 106 includes moderately doped p-type semiconductor material, while the shallower first n-type region 108 includes moderately doped n-type semiconductor material that overlies the first p-type region 106. In particular embodiments, the first p-type region 106 has a doping concentration between about $1\times10^{16}$ cm$^{-3}$ to about $1\times10^{18}$ cm$^{-3}$, and the first p-type region 106 has a thickness (in the vertical dimension depicted in FIG. 3 and FIG. 4) between about 0.25 microns to about 2.5 microns. Moreover, the first n-type region 108 may have a doping concentration between about $1\times10^{16}$ cm$^{-3}$ to about $1\times10^{18}$ cm$^{-3}$, and the first n-type region 108 may have a thickness (in the vertical dimension depicted in FIG. 3 and FIG. 4) between about 0.25 microns to about 2.5 microns. In other embodiments, the first p-type region 106 and the first n-type region 108 could be formed by different implant steps or doping procedures with different masks.

The Zener implant region 110 is formed in the first n-type region 108, as depicted in FIGS. 1-3. In one embodiment, the Zener implant region 110 is formed not only in the first n-type region 108, but also in upper portion of the first p-type region 106. In other embodiments, the Zener implant region 110 is formed only in the first n-type region 108. In this example, the Zener implant region 110 is formed at or near the center of the vertical Zener diode 100 (see FIG. 1, which depicts the Zener implant region 110 as a square for simplicity). As depicted in FIG. 3, the Zener implant region 110 is surrounded by the first n-type region 108 and the first p-type region 106, it is located under the anode region 112, and it extends vertically from the anode region 112 (or near the anode region 112) toward the first p-type region 106. The Zener implant region 110 is realized as highly doped n-type semiconductor material. In certain embodiments, the Zener implant region 110 has a doping concentration between about $5\times10^{18}$ cm$^{-3}$ to about $5\times10^{19}$ cm$^{-3}$.

The anode region 112 and the cathode contact region 114 may both be formed in the first n-type region 108, as shown in FIGS. 2-4. More specifically, the anode region 112 and the cathode contact region 114 are formed at and near the upper surface of the first n-type region 108. For this embodiment, the anode region 112 is formed from heavily doped p-type semiconductor material, with a doping concentration between about $1\times10^{20}$ cm$^{-3}$ to about $1\times10^{22}$ cm$^{-3}$, and the cathode contact region 114 is formed from heavily doped n-type semiconductor material, with a doping concentration between about $1\times10^{20}$ cm$^{-3}$ to about $1\times10^{22}$ cm$^{-3}$. Since the anode region 112 and the cathode contact region 114 are formed in active semiconductor regions, they may be realized as shallow and heavily doped source/drain regions (for example, the anode region 112 may be referred to as a p-type source/drain region, and the cathode contact region 114 may be referred to as an n-type source/drain region). The anode region 112 and the cathode contact region 114 can be formed using known semiconductor process techniques, including photolithography, source/drain ion implantation, silicidation, and thermal activation. These familiar process steps will not be described in detail here.

For this embodiment, the anode region 112 overlies the entire Zener implant region 110 (see FIG. 1 and FIG. 3). More specifically, the Zener implant region 110 is electrically connected to, and physically contacts, the anode region 112. Therefore, the p-n junction formed by the anode region 112 and the Zener implant region 110 resides in the first n-type region 108. Moreover, the anode region 112 overlies at least a portion of each p-type plug region 120 (see FIG. 1 and FIG. 4). For such a configuration, each p-type plug region 120 extends from an edge portion of the anode region 112 to the first p-type region 106. In practice, it may be desirable to position the p-type plug regions 120 away from the Zener breakdown junction. However, manufacturing design rules might call for a minimum width requirement for the p-type plug regions 120. Accordingly, the p-type plug regions 120 might extend beyond the boundary of the anode region 112 (as depicted in FIG. 1). However, this extension beyond the boundary of the anode region 112 is not always required. In alternate embodiments, conductive routing, metal interconnect structures, or other electrically conductive elements could be used to couple the anode potential to the first p-type region 106 and the second p-type region 116. For these embodiments, the p-type plug regions 120 are optional.

The relationship between the cathode contact region 114, the Zener implant region 110, and the p-type plug regions 120 is described in more detail below. For this embodiment, the cathode contact region 114 resembles a ring that does not overlie any portion of the Zener implant region 110. In other words, in the top view depicted in FIG. 1, the cathode contact region 114 encircles the Zener implant region 110. Likewise, the cathode contact region 114 does not overlie any of the p-type plug regions 120 in this embodiment, as shown in FIG. 1 and FIG. 4. In other embodiments, the cathode contact region 114 can overlie part of the p-type plug regions 120 as long as such a configuration does not affect the breakdown event of the vertical Zener diode 100. Note that the cathode contact region 114, the first n-type region 108, and the Zener implant region 110 are partially surrounded by p-type material (which is formed by the first p-type region 106 on the bottom and by the second p-type region 116 on the side), as shown in FIG. 3.

As best shown in FIG. 4, each p-type plug region 120 resides within the first n-type region 108, and the p-type plug regions 120 are realized as moderately doped p-type semiconductor material. In certain embodiments, the p-type plug regions 120 may have a doping concentration between about $1 \times 10^{17}$ cm$^{-3}$ to about $1 \times 10^{19}$ cm$^{-3}$. Each p-type plug region 120 is formed overlying a portion of the NBL 104, and each p-type plug region 120 electrically connects the underlying first p-type region 106 with the anode region 112 (with no intervening contact region or contact material). FIG. 4 depicts the p-type plug regions 120 extending from the anode region 112, through the first n-type region 108, through the first p-type region 106, and to the NBL 104. In practice, however, the p-type plug regions 120 need not always extend all the way to the NBL 104. As should be apparent from FIG. 1 and FIG. 4, the upper portion of each p-type plug region 120 is surrounded by the first n-type region 108, while the lower portion of each p-type plug region 120 is surrounded by the first p-type region 106. The p-type plug regions 120 electrically connect the anode region 112 to the underlying and surrounding p-type material (i.e., the first p-type region 106 and the second p-type region 116). In exemplary embodiments that utilize a plurality of p-type plug regions 120, they may be suitably arranged and positioned such that they flank the Zener implant region 110, as illustrated in FIG. 1.

In the vertical Zener diode 100, the second p-type region 116 is electrically connected to, and physically contacts, the first p-type region 106. Moreover, the first p-type region 106 is electrically connected to, and physically contacts, each p-type plug region 120. In turn, each p-type plug region 120 is electrically connected to, and physically contacts, the anode region 112. Consequently, the potential maintained at the anode terminal of the vertical Zener diode 100 will also be present at the p-type plug regions 120, the first p-type region 106, and the second p-type region 116.

Figure 5:
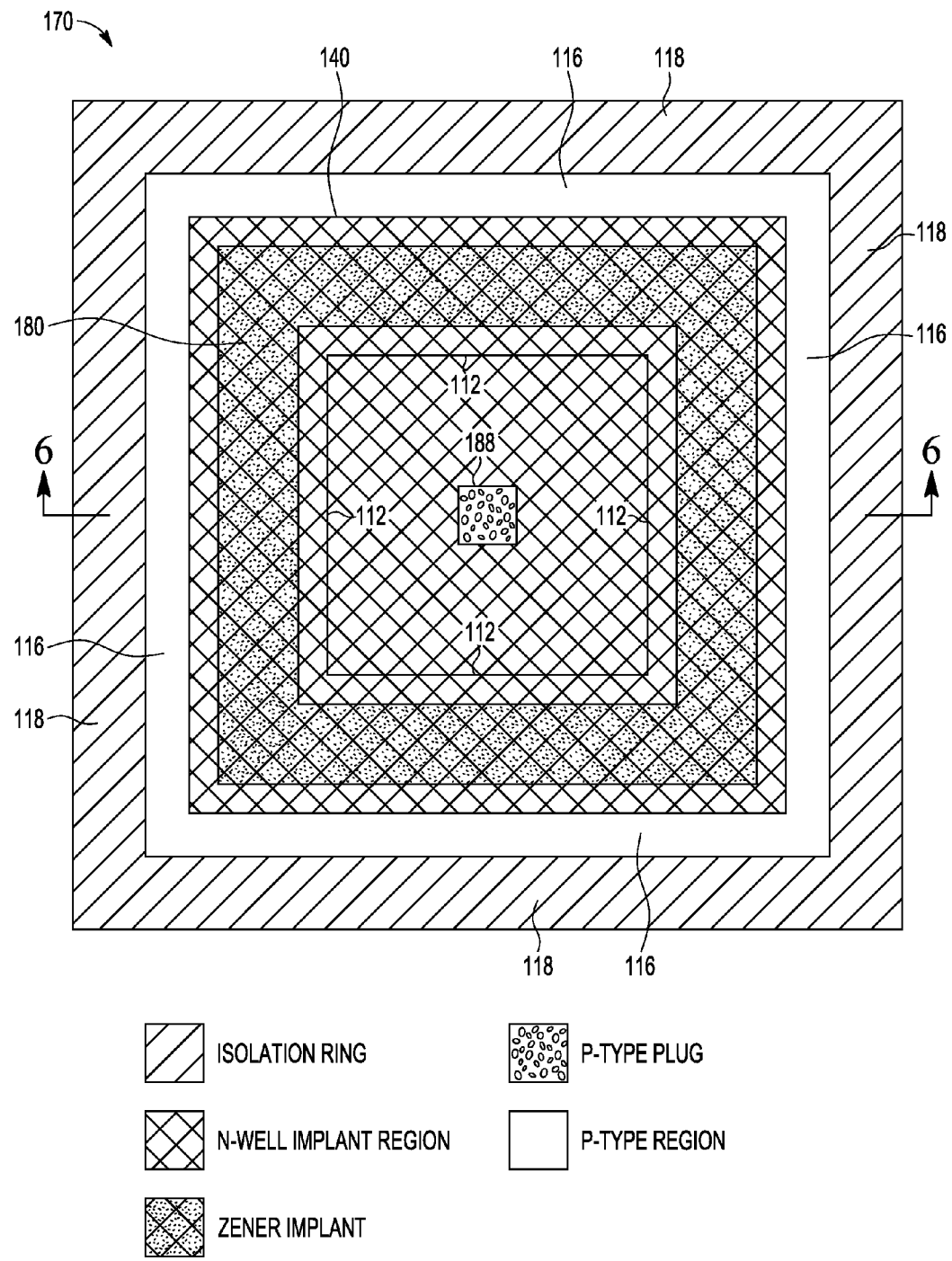
FIG. 5 is a top phantom view of a semiconductor-based lateral Zener diode configured in accordance with an embodiment of the invention.
Figure 6:
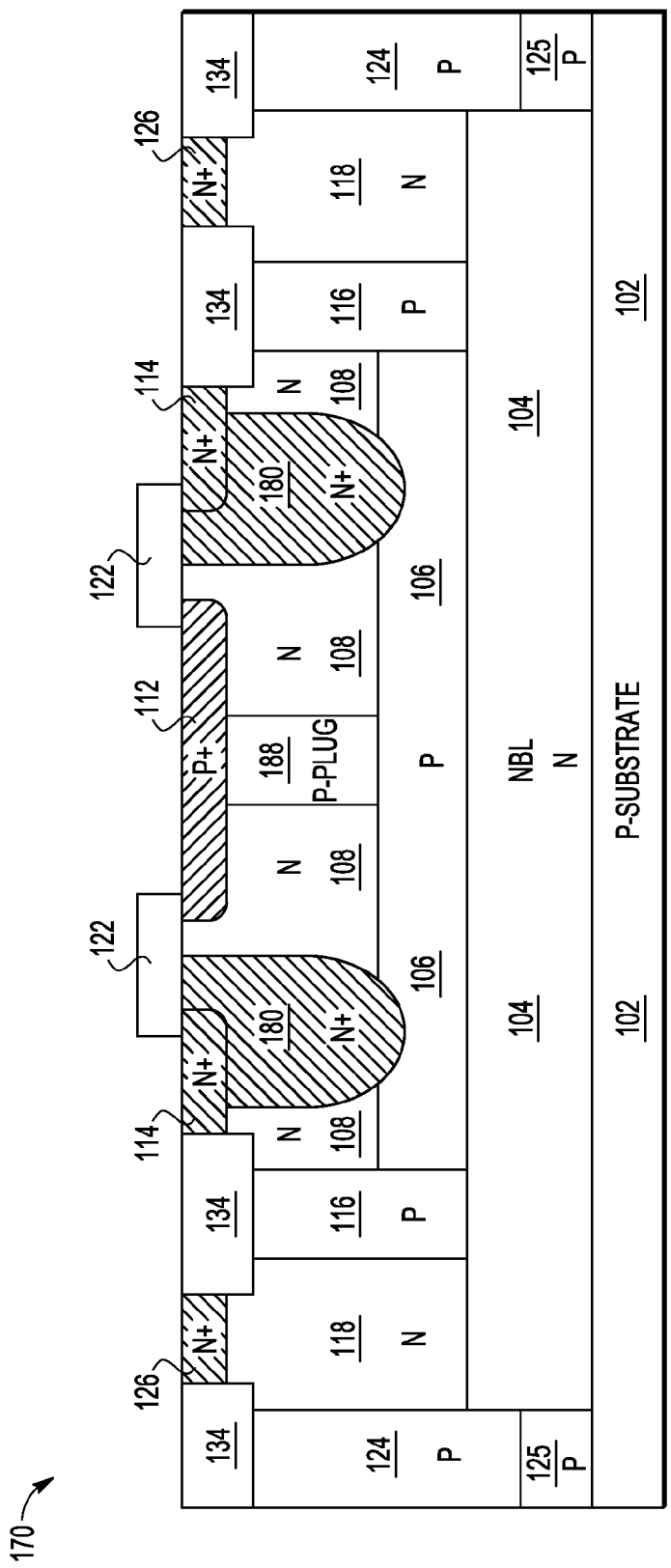
FIG. 6 is a cross sectional view of the lateral Zener diode, as viewed along line 6-6 shown in FIG. 5.

FIGS. 1-4 depict a vertical Zener diode structure. It should be appreciated that the concepts, techniques, and technologies described above for the vertical Zener diode 100 can be equivalently applied to a lateral Zener diode device structure. In this regard, FIG. 5 is a top phantom view of a semiconductor-based lateral Zener diode device 170 configured in accordance with an exemplary embodiment, and FIG. 6 is a cross sectional view of the lateral Zener diode 170, as viewed along line 6-6 shown in FIG. 5. The lateral Zener diode 170 is similar to the vertical Zener diode 100 described in detail above, and common or equivalent features, structures, and elements are labeled with the same reference numbers throughout the figures. For the sake of brevity, such common or equivalent features, structures, and elements will not be redundantly described in detail here for the lateral Zener diode 170.

The lateral Zener diode 170 employs a Zener implant region 180 formed in the first n-type region 108. As shown in FIG. 5 and FIG. 6, the Zener implant region 180 encircles the anode region 112. The Zener implant region 180 is electrically connected to, and physically contacts, the cathode contact region 114 (unlike the Zener implant region 110 used in the vertical Zener diode 100, which is electrically connected to the anode region 112). In this example, the Zener implant region 180 extends from the cathode contact region 114 toward and into the first p-type region 106. Moreover, the lateral Zener diode 170 employs only one p-type plug region 188, which is electrically connected between the anode region 112 and the first p-type region 106 (as shown in FIG. 6). For this embodiment, at least a portion of the p-type plug region 188 is flanked by the Zener implant region 180. More specifically, the Zener implant region 180 encircles the p-type plug region 188 (i.e., the p-type plug region 188 resides within the interior space that is generally defined by the Zener implant region 180. As with the vertical Zener diode 100, the second p-type region 116 can be extended from the NBL 104 to the upper surface of the lateral Zener diode 170. By adding a contact region in the second p-type region 116 at and near the upper surface, the first p-type region 106 and the second p-type region 116 can be coupled with the anode potential by conductive routing or local interconnect structures. For this embodiment, the p-type plug region 188 is optional.

When the vertical Zener diode 100 or the lateral Zener diode 170 is forward biased, the voltage potential at the anode region 112 is higher than the voltage potential at the cathode contact region 114. This results in forward current from the anode region 112 to the cathode contact region 114, as is well understood. When reverse biased, the voltage potential at the cathode contact region 114 is higher than the voltage potential at the anode region 112. When the reverse bias voltage exceeds the Zener diode breakdown voltage, reverse current flows from the cathode contact region 114 to the anode region 112, as is well understood.

A conventional Zener diode typically exhibits high substrate current at the reverse bias breakdown point. In this regard, a high level of electron injection into the cathode region during breakdown dramatically increases the hole density at the edge of the p-n junction on the cathode side, due to the requirement of charge neutrality. Some excess holes diffuse to the p-n junction formed by the cathode region and the p-type substrate, where the electric field across the junction sweeps the holes into the semiconductor substrate, forming a high injected substrate current. The large substrate current caused by reverse breakdown in such conventional Zener diodes is undesirable, as it can disturb operation of other components of the circuit with which it is integrated.

Each of the vertical Zener diode 100 and the lateral Zener diode 170, however, may be considered to be a combination of a Zener diode and a regular p-n junction diode in parallel. The regular p-n diode shares the same cathode region with the Zener diode and shields the Zener diode from the semiconductor substrate 102, suppressing the substrate current during a Zener breakdown event. The cathode contact region 114, the first n-type region 108, and the Zener implant region 110/180 is partially surrounded by the second p-type region 116 and the first p-type region 106, which are connected to the anode region 112 by the p-type plug regions 120/188. Thus, the second p-type region 116 and the first p-type region 106 will be biased with the anode potential of the anode region 112. During reverse bias operation, the second p-type region 116 and the first p-type region 106 collect holes that diffuse from the cathode region towards the semiconductor substrate 102, redirect such hole current to the anode region 112 via the p-type plug regions 120/188, and substantially reduce the substrate current during a breakdown event under sufficiently high reverse bias.

Moreover, the vertical Zener diode 100 and the lateral Zener diode 170 are effectively isolated from their respective semiconductor substrate 102 by the isolation ring (e.g., the second n-type region 118 and the NBL 104), which can be biased from Vss to Vdd without affecting the traditional operating characteristics of the diodes. In this regard, it has been found that when the isolation ring is grounded, the substrate current is lowered by several orders of magnitude. Moreover, when the isolation ring is biased at Vdd, the substrate current is attributed to the leakage across the p-n junction between the isolation ring and the semiconductor substrate 102. Thus, the device structure of the vertical Zener diode 100 and the lateral Zener diode 170 effectively suppresses the substrate current during a breakdown event under sufficiently high reverse bias, which can be a major mode of operation for a Zener diode in applications such as protection circuits.

It should also be appreciated that Zener diodes having the structure and features described above could be fabricated using a p-type Zener implant region rather than an n-type Zener implant region. In other words, a vertical or lateral Zener diode can be fabricated in an equivalent manner by reversing the conductivity type of the various implant and well regions described above.

In summary, systems, devices, and methods configured in accordance with exemplary embodiments relate to:

(1) A Zener diode having: a substrate including semiconductor material; a first region having a first conductivity type, formed in the semiconductor material; a second region having a second conductivity type, formed in the semiconductor material and overlying the first region, wherein the second conductivity type is opposite the first conductivity type; and an electrode formed in the second region, wherein the electrode is electrically coupled to the first region. This Zener diode may also include a plug region having the first conductivity type, the plug region extending from the electrode to the first region. The Zener diode may further include a first outer region having the first conductivity type, the first outer region being outboard the first region and the second region, and the first region extending to the first outer region. In some embodiments, the first outer region is electrically connected to the first region, the first region is electrically connected to the plug region, and the plug region is electrically connected to the electrode. In some embodiments, the first outer region physically contacts the first region, the first region physically contacts the plug region, and the plug region physically contacts the electrode. The Zener diode may further include a third region formed in the second region, the third region having the second conductivity type, and the third region extending from the electrode. The third region may be electrically connected to, and physically contacts, the electrode. In some embodiments, the plug region comprises a plurality of plugs having the first conductivity type. In some embodiments, at least a portion of the plug region is flanked by the third region. The Zener diode may also include an isolation structure formed in the semiconductor material, the isolation structure at least partially surrounding the first region and the second region. In operation, the Zener diode is substantially free of substrate injection current when reverse biased. In some embodiments, the first conductivity type is n-type and the second conductivity type is p-type. In other embodiments, the first conductivity type is p-type and the second conductivity type is n-type. The Zener diode may also include conductive routing that electrically couples the electrode to the first region. The conductive routing may comprise a local interconnect.

(2) A Zener diode having: a substrate including semiconductor material; an isolation tub located in the semiconductor material, the isolation tub generally defining a first interior volume; a first-type well region located in the semiconductor material, the first-type well region being generally configured as a sidewall located within the first interior volume, the sidewall generally defining a second interior volume; a first-type region located in the semiconductor material, the first-type region being located within the second interior volume; a second-type region formed in the semiconductor material, the second-type region being located within the second interior volume and overlying the first-type region; an electrode region formed in the second-type region; a first-type plug region extending from the electrode region to the first-type region, the first-type plug region electrically connecting the electrode region to the first-type region; and a Zener region formed in the second-type region, the Zener region extending from the electrode region toward the first-type region. In this Zener diode, the first-type plug region may extend from a portion of the electrode region to the first-type region. The first-type region may be electrically connected to the first-type well region. In some embodiments, the isolation tub comprises moderately doped second-type semiconductor material, the first-type well region comprises moderately doped first-type semiconductor material, the first-type region comprises moderately doped first-type semiconductor material, the second-type region comprises moderately doped second-type semiconductor material, the electrode region comprises highly doped first-type semiconductor material, the first-type plug region comprises moderately doped first-type semiconductor material, and the Zener region comprises highly doped second-type semiconductor material. The Zener diode may also include an electrode for biasing the isolation tub.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A Zener diode comprising:
   a substrate including semiconductor material having a first conductivity type;
   an isolation tub located in the semiconductor material, the isolation tub having a second conductivity type, and the isolation tub generally defining a first interior volume;
   a sidewall located within the first interior volume, the sidewall having the first conductivity type, and the sidewall generally defining a second interior volume;
   a first region having the first conductivity type, formed in the semiconductor material, the first region located within the second interior volume;
   a second region having the second conductivity type, formed in the semiconductor material and overlying the first region, the second region located within the second interior volume, wherein the second conductivity type is opposite the first conductivity type; and
   an electrode formed in the second region, wherein the electrode is electrically coupled to the first region.

2. The Zener diode of claim 1, further comprising a plug region having the first conductivity type, the plug region extending from the electrode to the first region.

3. The Zener diode of claim 1, wherein:
the sidewall is electrically connected to the first region;
the first region is electrically connected to the plug region; and
the plug region is electrically connected to the electrode.

4. The Zener diode of claim 3, wherein:
the sidewall physically contacts the first region;
the first region physically contacts the plug region; and
the plug region physically contacts the electrode.

5. The Zener diode of claim 2, further comprising a third region formed in the second region, the third region having the second conductivity type, and the third region extending from the electrode.

6. The Zener diode of claim 5, wherein the third region is electrically connected to, and physically contacts, the electrode.

7. The Zener diode of claim 5, wherein the plug region comprises a plurality of plugs having the first conductivity type.

8. The Zener diode of claim 5, wherein at least a portion of the plug region is flanked by the third region.

9. The Zener diode of claim 1, wherein the Zener diode is substantially free of substrate injection current when reverse biased.

10. The Zener diode of claim 1, wherein the first conductivity type is n-type and the second conductivity type is p-type.

11. The Zener diode of claim 1, wherein the first conductivity type is p-type and the second conductivity type is n-type.

12. A Zener diode comprising:
a substrate including semiconductor material;
an isolation tub located in the semiconductor material, the isolation tub generally defining a first interior volume;
a first-type well region located in the semiconductor material, the first-type well region being generally configured as a sidewall located within the first interior volume, the sidewall generally defining a second interior volume;
a first-type region located in the semiconductor material, the first-type region being located within the second interior volume;
a second-type region formed in the semiconductor material, the second-type region being located within the second interior volume and overlying the first-type region;
an electrode region formed in the second-type region;
a first-type plug region extending from the electrode region to the first-type region, the first-type plug region electrically connecting the electrode region to the first-type region; and
a Zener implant region formed in the second-type region, the Zener implant region extending from the electrode region toward the first-type region.

13. The Zener diode of claim 12, wherein the first-type plug region extends from a portion of the electrode region to the first-type region.

14. The Zener diode of claim 12, wherein the first-type region is electrically connected to the first-type well region.

15. The Zener diode of claim 12, wherein:
the isolation tub comprises moderately doped second-type semiconductor material;
the first-type well region comprises moderately doped first-type semiconductor material;
the first-type region comprises moderately doped first-type semiconductor material;
the second-type region comprises moderately doped second-type semiconductor material;
the electrode region comprises highly doped first-type semiconductor material;
the first-type plug region comprises moderately doped first-type semiconductor material; and
the Zener implant region comprises highly doped second-type semiconductor material.

16. The Zener diode of claim 12, further comprising an electrode for biasing the isolation tub.

* * * * *